United States Patent [19]

Schwarzbauer

[11] Patent Number: 5,654,586

[45] Date of Patent: Aug. 5, 1997

[54] POWER SEMICONDUCTOR COMPONENT HAVING A BUFFER LAYER

[75] Inventor: Herbert Schwarzbauer, München, Germany

[73] Assignee: Siemens Aktiengesellschaft, Munich, Germany

[21] Appl. No.: 545,694

[22] PCT Filed: May 2, 1994

[86] PCT No.: PCT/DE94/00483

§ 371 Date: Nov. 7, 1995

§ 102(e) Date: Nov. 7, 1995

[87] PCT Pub. No.: WO94/27319

PCT Pub. Date: Nov. 24, 1994

[30] Foreign Application Priority Data

May 7, 1993 [FR] France .................. 43 15 272.4

[51] Int. Cl.⁶ .................. H01L 23/053; H01L 23/12
[52] U.S. Cl. .................. 257/701; 257/700; 257/703; 257/705; 257/706
[58] Field of Search .................. 257/700, 701, 257/703, 705, 706, 707, 709

[56] References Cited

U.S. PATENT DOCUMENTS 3,839,660 10/1974 Stryker .................. 357/67
4,651,192 3/1987 Matsushita et al. .................. 357/74

FOREIGN PATENT DOCUMENTS

| 0 139 205 | 5/1985 | European Pat. Off. . |
| 0 194 475 | 9/1986 | European Pat. Off. . |
| 0 242 626 | 10/1987 | European Pat. Off. . |
| 34 14 065 | 12/1985 | Germany . |

Primary Examiner—Sara W. Crane
Assistant Examiner—Douglas Willie
Attorney, Agent, or Firm—Hill, Steadman & Simpson

[57] ABSTRACT

In a power semiconductor component a ceramic substrate (SUB) and a metallic baseplate (BP) are connected, in order, via a connecting layer (2), a buffer layer (DP) made of a material having a low yield point and high thermal conductivity as well as a further connecting layer (3). The mechanical connections between the ceramic substrate and the baseplate have a high shear strength. Premature material fatigue and cracking on account of the different thermal expansion of the ceramic substrate and the baseplate are avoided by means of plastic deformation of the buffer layer. Connecting layers are, for example, sintered silver powder layers such as are advantageously used in the low-temperature connection technique for power semiconductor components.

2 Claims, 1 Drawing Sheet

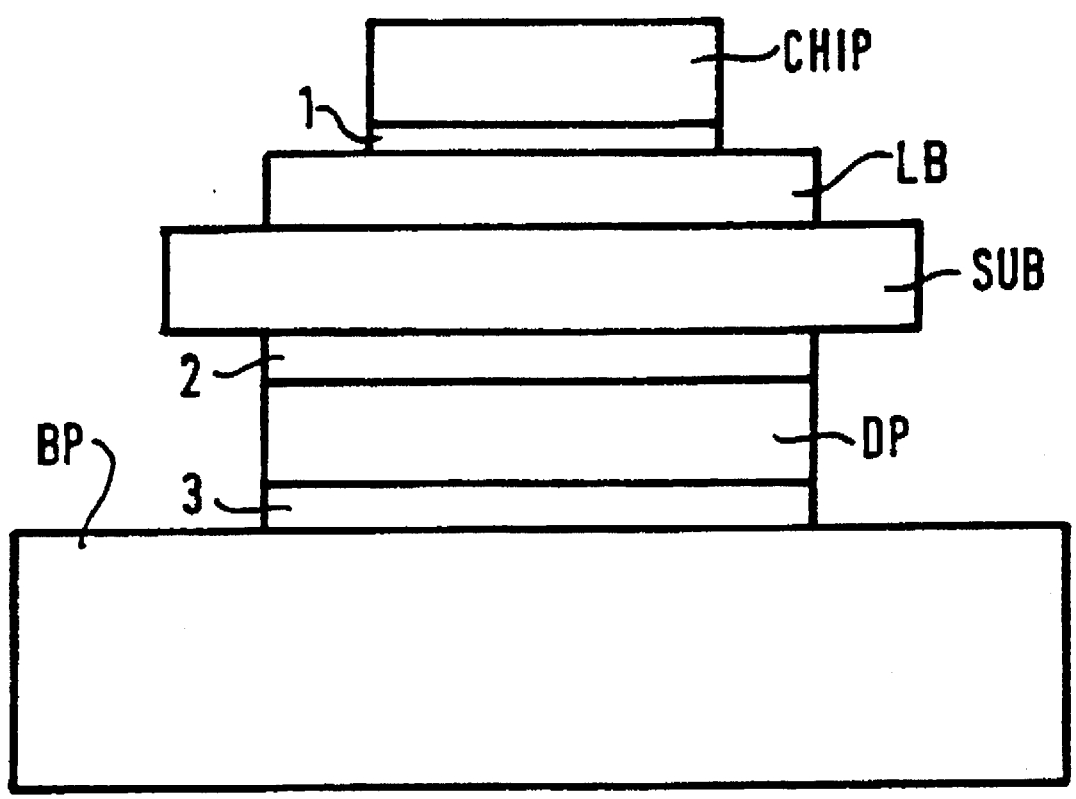

POWER SEMICONDUCTOR COMPONENT HAVING A BUFFER LAYER

BACKGROUND OF THE INVENTION

Power semiconductor components in which semiconductor chips are connected to ceramic substrates via pressure-sintered silver powder layers are disclosed, for example, in the European patent specification having the publication number 0 242 626 B1 or in German Offenlegungsschrift DE 34 14 065 A1.

Such low-temperature connection techniques which make use, for example, of silver powder layers can also be used, in the case of power semiconductor components, for connecting ceramic substrates to metallic baseplates. However, the changing temperature on account of the power loss to be dissipated leads here to premature material fatigue and cracking precisely because of the considerably different thermal expansion coefficients, since although the layers which are customarily used in the low-temperature connection technique, such as, for example, the sintered silver powder layers, have a substantially higher thermal conductivity than, for example, connections using lead/tin-based soft solders, the connections which are obtained cannot, in contrast therewith, be plastically deformed.

The European application document having the publication number 0 139 205 discloses thermal expansion matching between an insulating layer and a metal substrate, in the case of which there is provided an adhesion layer which comprises partial layers, for example made of aluminum or copper, aluminum oxide, for example, or other oxides being increasingly added to the partial layers. However, the increased electrical resistance and the increased technical outlay are disadvantageous in this case.

The invention is based on the object, then, of specifying a power semiconductor component in which the advantage of a high thermal conductivity between the ceramic substrate and the metallic baseplate is ensured and the disadvantage of premature material fatigue and cracking is avoided.

SUMMARY OF THE INVENTION

In general terms the present invention is a power semiconductor component, in which conductor tracks are applied to one side of a ceramic substrate and are mechanically connected to at least one semiconductor chip using a first connecting layer. A stress buffer layer made of a metal from the group consisting of copper, silver or pure aluminum with an aluminum content of more than 99 percent is applied to the other side of the ceramic substrate using a second connecting layer. The buffer layer is connected to metallic baseplate via a third connecting layer. The connecting layers consist of sintered silver powder.

In an advantageous development of the present invention the stress buffer layer has a thickness of 50 to 200 μm.

BRIEF DESCRIPTION OF THE DRAWING

The features of the present invention which are believed to be novel, are set forth with particularity in the appended claims. The invention, together with further objects and advantages, may best be understood by reference to the following description taken in conjunction with the accompanying drawing, in which:

The single FIGURE is a side view of a power semiconductor component according to the present invention.

DESCRIPTION OF THE PREFERRED EMBODIMENTS

The single FIGURE illustrates a side view of a power semiconductor component according to the invention. In this case, the power semiconductor component according to the invention comprises, in order, a semiconductor chip CHIP, a connecting layer 1, conductor tracks LB, a ceramic substrate SUB, a connecting layer 2, a buffer layer made of a material having a low yield point, a further connecting layer 3 and a metallic baseplate BP.

The semiconductor chip CHIP typically comprises doped silicon and the conductor tracks LB, which consist, for example, of copper, are typically applied to the ceramic substrate SUB, which consists, for example, of aluminum oxide, so-called DCB substrates (direct copper bonding substrates), which are commercially available, generally being used in this case. The baseplate BP consists, for example, of copper. The connecting layers 2 and 3 and, generally, the connecting layer 1, too, preferably consist of sintered silver powder and the layer thickness is approximately 10 μm. The buffer layer typically consists of largely pure aluminum which typically has an Al content of more than 99 percent and has a low yield point of approximately up to 20 N/mm2, the layer thickness of the buffer layer being approximately 50 to 200 μm.

In addition to aluminum, other materials having a low yield point and high thermal conductivity, such as, for example, copper or silver, can also be used as the material for the buffer layer.

Owing to the very different thermal expansion coefficients, in the event of temperature changes mechanical stresses are produced, in particular between the ceramic substrate SUB and the baseplate BP, if no buffer layer DP is provided, since the shear strength of the connection comprising the ceramic substrate SUB, the connecting layer 2 and 3 and the baseplate BP is very high. If there is no buffer layer, premature material fatigue phenomena and cracking are produced, above all in the connecting layers 2 and 3, because of the thermomechanical stresses.

The use of a buffer layer (stress buffer layer), for example made of soft pure aluminum, relieves the stresses and the abovementioned disadvantages are thereby avoided and, nevertheless, a very good thermal resistance is ensured.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A power semiconductor component, comprising:
   a ceramic substrate having at least one semiconductor chip;
   conductor tracks on one side of the ceramic substrate and mechanically connected to the at least one semiconductor chip via a first connecting layer;
   a stress buffer layer made of a metal from the group consisting of copper, silver and pure aluminum with an aluminum content of more than 99 percent on the other side of the ceramic substrate via a second connecting layer;
   a metallic baseplate connected to the buffer layer via a third connecting layer; and
   the first, second and third connecting layers consisting of sintered silver powder.

2. The power semiconductor component as claimed in claim 1, in which the stress buffer layer has a thickness in the range of 50 to 200 μm.

* * * * *